(12) United States Patent
Jaakkola et al.

(10) Patent No.: US 10,931,255 B2
(45) Date of Patent: Feb. 23, 2021

(54) MICROMECHANICAL RESONATOR

(71) Applicant: TEKNOLOGIAN TUTKIMUSKESKUS VTT OY, Espoo (FI)

(72) Inventors: Antti Jaakkola, Espoo (FI); Panu Pekko, Espoo (FI)

(73) Assignee: TEKNOLOGIAN TUTKIMUSKESKUS VTT OY, Espoo (FI)

(*) Notice: Subject to any disclaimer, the term of this patent is extended or adjusted under 35 U.S.C. 154(b) by 112 days.

(21) Appl. No.: 16/313,655

(22) PCT Filed: Jun. 29, 2017

(86) PCT No.: PCT/FI2017/050486
§ 371 (c)(1),
(2) Date: Dec. 27, 2018

(87) PCT Pub. No.: WO2018/002439
PCT Pub. Date: Jan. 4, 2018

(65) Prior Publication Data
US 2019/0173450 A1    Jun. 6, 2019

(30) Foreign Application Priority Data
Jul. 1, 2016   (FI) ..................... 20165553

(51) Int. Cl.
*H03H 9/02* (2006.01)
*H03H 9/24* (2006.01)

(52) U.S. Cl.
CPC .... *H03H 9/02448* (2013.01); *H03H 9/02338* (2013.01); *H03H 9/2405* (2013.01);
(Continued)

(58) Field of Classification Search
CPC ........... H03H 9/02448; H03H 9/02338; H03H 9/2405; H03H 9/2447; H03H 9/2442; H03H 9/02385; H03H 9/02527
See application file for complete search history.

(56) References Cited

U.S. PATENT DOCUMENTS 9,299,910 B1 *   3/2016   Sparks .............. H03H 9/02338
9,431,993 B1 *   8/2016   Hsu .................... H03H 9/02244
(Continued)

FOREIGN PATENT DOCUMENTS

EP      2 479 891       7/2012
WO    2010/077313      7/2010
(Continued)

OTHER PUBLICATIONS

International Search Report for PCT/FI2017/050486 dated Oct. 27, 2017, 7 pages.
(Continued)

*Primary Examiner* — J. San Martin
(74) *Attorney, Agent, or Firm* — Nixon & Vanderhye PC

(57) ABSTRACT

The present disclosure describes a micromechanical resonator comprising a resonator element (40) having a length ($l_1$) and a width ($w_1$) that is perpendicular to the length. The resonator element has a length-to-width aspect ratio in a range of 1.8 to 2.2. The resonator element is suspended to a support structure with two or more anchors (41, 43). Each of the two or more anchors is attached to a first location or a second location. The first location is at a shorter side (42) of the resonator element. The first location divides the width ($w_1$) of the resonator element into a larger portion ($w_3$) and a smaller portion ($w_2$) such that a ratio between said smaller portion ($w_2$) and the whole width ($w_1$) is in a range of 0.10 to 0.28. The second location is at a longer side (44). The second location divides the length ($l_1$) of the resonator element into a larger portion ($l_3$) and a smaller portion ($l_2$)
(Continued)

such that a ratio between said smaller portion ($l_2$) and the whole length ($l_1$) is in a range of 0.36 to 0.48.

6 Claims, 4 Drawing Sheets

(52) U.S. Cl.
CPC . *H03H 9/2447* (2013.01); *H03H 2009/02385* (2013.01); *H03H 2009/02527* (2013.01); *H03H 2009/2442* (2013.01)

(56) References Cited

U.S. PATENT DOCUMENTS

| | | | | |
|---|---|---|---|---|
| 9,954,513 | B1* | 4/2018 | Thalmayr | H03H 9/02338 |
| 9,991,869 | B2* | 6/2018 | Jaakkola | H03H 9/0538 |
| 10,333,052 | B2* | 6/2019 | Nishimura | H01L 41/053 |
| 2003/0117237 | A1* | 6/2003 | Niu | H03H 9/02338 |
| | | | | 333/187 |
| 2010/0181868 | A1* | 7/2010 | Gaidarzhy | H03H 9/02228 |
| | | | | 310/313 B |
| 2010/0319185 | A1* | 12/2010 | Ayazi | H03H 3/0076 |
| | | | | 29/594 |
| 2012/0092082 | A1* | 4/2012 | Hentz | H03H 9/02338 |
| | | | | 331/154 |
| 2016/0099704 | A1* | 4/2016 | Jaakkola | H03H 9/2436 |
| | | | | 310/321 |
| 2016/0111627 | A1 | 4/2016 | Hase et al. | |
| 2018/0183403 | A1* | 6/2018 | Kaajakari | H03H 9/205 |

FOREIGN PATENT DOCUMENTS

| | | |
|---|---|---|
| WO | 2012/020172 | 2/2012 |
| WO | 2016/051023 | 4/2016 |
| WO | 2016/051025 | 4/2016 |

OTHER PUBLICATIONS

Written Opinion of the ISA for PCT/FI2017/050486 dated Oct. 27, 2017, 5 pages.
Search Report for FI20165553 dated Jan. 17, 2017, 2 pages.
Harrington et al., "Toward ultimate performance in GHZ MEMs resonators: Low impedance and high Q", Micro Electro Mechanical Systems, Jan. 24, 2010, pp. 707-710.
Cheng et al., "VHF-band biconvex AlN-on-silicon micromechanical resonators with enhanced quality factor and suppressed spurious modes", Journal of Micromechanics & Microengineering, Institute of Physics Publishing, vol. 26, No. 6, May 6, 2016, 11 pages.
Humad et al., "High frequency micromechanical piezo-on-silicon block resonators", IEEE International Electron Devices Meeting 2003, Jan. 1, 2003, pp. 39.3.1-39.3.4.

\* cited by examiner

MICROMECHANICAL RESONATOR

This application is the U.S. national phase of International Application No. PCT/FI2017/050486 filed Jun. 29, 2017 which designated the U.S. and claims priority to FI Patent Application No. 20165553 filed Jul. 1, 2016, the entire contents of each of which are hereby incorporated by reference.

FIELD

The present invention relates to micromechanical resonators, and more particularly to controlling temperature coefficient of frequency (TCF) of such resonators.

BACKGROUND

Traditionally, mechanical resonators have been based on quartz crystals. Quartz-based resonator approaches can provide a high frequency stability. Micromechanical resonators that are based on semiconductor materials, such as silicon, are emerging as an alternative for the quartz-based resonators. Micromechanical resonators have some advantages over the quartz-based resonators. For example, micromechanical resonators can be smaller and can be manufactured with a lower price. However, achieving the same degree of frequency stability as in quartz-based resonators may be challenging.

BRIEF DESCRIPTION

An object of the present invention is to provide a micromechanical resonator structure so as to alleviate the above disadvantage. The objects of the invention are achieved by resonator structure which is characterized by what is stated in the independent claims. Preferred embodiments of the invention are disclosed in the dependent claims.

A piezoelectrically actuated micromechanical resonator may comprise a piezoelectrical layer structure on top of a semiconductor base layer structure. The piezoelectrical layer structure may introduce a negative contribution to the effective linear TCF of the resonator element. The negative contribution may have a higher magnitude than a positive contribution of the silicon base layer structure. As a result, the linear TCF of the resonator element may be negative when a zero linear TCF would be desirable.

In order to compensate the negative TCF, a specific length-to-width aspect ratio may be selected for the resonator element. As a result, the resonator element resonates in two different types of resonance modes, i.e. a width-extensional (WE) mode and a shear mode, that couple into two distinguishable mixed resonance mode branches, i.e. a first, lower-frequency mixed resonance mode branch and a second, higher-frequency mixed resonance mode branch. When the two different types of resonance modes couple to each other, their properties, such as the temperature characteristics (TCF) and the strength of piezoelectric coupling strength, are both represented in the mixed mode branches.

By carefully selecting the positions of anchoring of the resonator element, it is possible to suppress the second mixed mode branch so that the first mixed mode becomes clearly dominant. The first mixed mode has a more positive linear TCF than the pure WE mode alone so the negative TCF component induced by the piezoelectric layer structure can be compensated, and an effective linear TCF of the resonator element can be adjusted to zero.

Piezoelectrically-actuated silicon resonators according to the present disclosure can thus offer same level of electrical performance as quartz crystals with the benefit of a smaller component size and with a lower price. Electrical characteristics are very similar to that of quartz crystals, and thus pin-to-pin compatibility can be achieved.

BRIEF DESCRIPTION OF THE DRAWINGS

In the following the invention will be described in greater detail by means of preferred embodiments with reference to the attached [accompanying] drawings, in which.

DETAILED DESCRIPTION

The present disclosure describes a micromechanical resonator. The resonator may comprise a resonator element having a length and a width that is perpendicular to the length. The length is longer than the width. Together, the length and the width define a plane of the resonator element. The resonator element may be in the form of a plate extending in the plane of the resonator element, i.e. the resonator may be a plate resonator.

The resonator element may comprise a first layer structure that comprises a base layer made of a semiconductor material, such as silicon. The length of the resonator element may extend along a [100] crystalline direction of the semiconductor material. The silicon material may have a positive linear TCF.

The silicon may be doped with an n-type dopant, such as phosphorus. The doping concentration of the silicon may be above $2 \cdot 10^{19}$ cm$^{-3}$, preferably above $1 \cdot 10^{20}$ cm$^{-3}$. With such a heavy doping, the quadratic (i.e. second order) TCF characteristics of the silicon material of the resonator element can be improved. For weakly or moderately doped silicon (carrier concentration $<1 \cdot 10^{19}$ cm$^{-3}$), the linear (i.e. first order) TCF may be around −30 ppm/C, and quadratic TCF may be clearly negative. With doping exceeding $2 \cdot 10^{19}$ cm$^{-3}$, the linear TCF can be zeroed and be made to have clearly positive values. The same applies also to the quadratic TCF. The linear TCF term (TCF1) of the silicon material may be about +10 ppm/° C. while the quadratic TCF term (TCF2) may be about +10 ppb/° C.$^2$ ($10 \cdot 10^{-9}$/° C.$^2$), for example.

Figure 1:
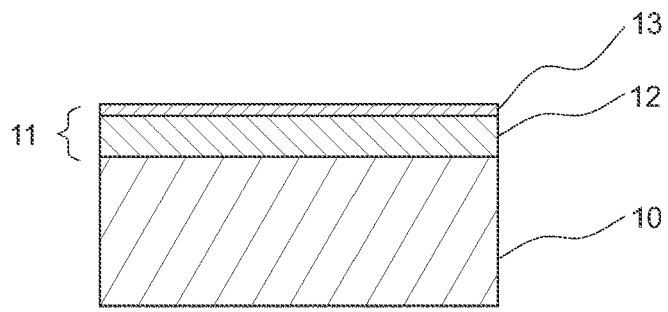
FIG. 1 shows an exemplary compound resonator structure according to the present disclosure.

The resonator element may be piezoelectrically actuated. The resonator element may be a compound structure comprising a second layer structure on top of the first layer structure in order to implement the piezoelectric actuation. The second layer structure may comprise piezoelectric material and electrode material stacked on top of the first layer structure. FIG. 1 shows an exemplary compound resonator structure according to the present disclosure. In FIG. 1, a silicon layer base forms the first layer structure 10. A second layer structure 11 is formed by a piezoelectric material 12 and an electrode material 13 on top of the first layer structure 10. In this exemplary resonator structure the silicon layer acts as the bottom electrode needed for piezoelectric actuation. The second layer structure may comprise additional material layers such as a separate bottom electrode layer or a silicon dioxide layer, for example.

The layers of the second layer structure, typically aluminium nitride (AlN) for the piezoelectric material, and aluminium (Al) or molybdenum (Mo) for the top electrode material, may have negative linear TCFs. By using a parallel spring-mass approximation for the resonator, the following mass-weighted averages for the frequency f and for the TCF may be calculated as a function of individual layer properties $f_i$, $TCF_i$ and $m_i$:

$$f^2 = \Sigma_i p_i f_i^2,$$

$$TCF = \Sigma_i p_i TCF_i,$$

$$p_i = m_i / \Sigma_j m_j. \quad (1)$$

In Equation (1), if the linear temperature coefficients of the first layer structure and the second layer structure may have opposite signs, the total frequency-vs-temperature characteristics of the compound resonator is modified from positive linear TCF of a bare heavily-doped silicon resonator.

Further, the resonance mode may contribute to the effective TCF of the resonator element. For example, a width-extensional mode may introduce a positive linear TCF term to the TCF of the resonator element.

In order to obtain as flat frequency-vs-temperature characteristics as possible, it may be desirable to try to match the positive contributions to the linear (and the quadratic) TCF with the negative contributions from the additional materials. In this context, "flat" temperature characteristics refer to TCF characteristics where the magnitude (i.e. the absolute value) of the linear TCF term is minimized, i.e. it is adjusted to a desired minimum value, preferably to zero.

However, in some cases, a zero linear TCF may not be directly achievable with the above measures. For example, it may be desirable to have a piezoelectrically actuated plate resonator resonate in a width-extensional (WE) resonance mode (e.g. approximately at 20 MHz) because said mode has good electrical performance (and thus good noise performance). The resonator may be in the form of a compound structure, where the first layer structure comprises a silicon (Si) base layer, and the second layer implementing the piezoelectric actuator comprises an aluminium nitride (AlN) layer and a molybdenum (Mo) layer. The Si/AlN/Mo stack thickness may be 15/0.8/0.3 micrometers (μm) in order to achieve sufficient electrical performance for the resonator. With stack thickness of this order, the positive TCF contributions of the WE mode and the silicon material may not be sufficiently high for compensating the negative TCF contributions from the AlN and Mo portions, and a compound resonator may have a negative linear TCF.

In order to minimize magnitude of the linear TCF term in the resonator structure, even when the positive contribution of the semiconductor material is not sufficient, a "mixed" (i.e. "hybrid") resonance mode may be used. The mixed mode has an inherently more positive TCF, and thus a zero linear TCF of compound resonator can be achieved. In the context of the present disclosure, a "mixed" mode or a "hybrid" mode may be considered to be a coupled resonance mode resulting from a coupling between two different, pure resonance modes. The terms "pure" or "clean" resonance mode in this context refer to a resonance mode having the characteristics of only one resonance mode type (i.e. solely a WE mode or a shear mode). As a result of the coupling, two mixed mode branches, i.e. a first mixed mode and a second mixed mode, are formed. The characteristics of these modes branches change in response to the in-plane characteristics of the resonator element. The term "in-plane characteristics" refers to the length and the width of the resonator element and to the aspect ratio between the length and the width. With the aspect ratio initially smaller than 2, the first mixed mode starts as a pure WE mode, and the second mixed mode starts as a pure shear mode. As the aspect ratio increases, the first mixed mode turns into a pure shear mode and the second mixed mode turns into a pure WE mode. At a certain range of the aspect ratio, i.e. at a mixing zone, the mixed mode branches have characteristics that are between the characteristics of the pure modes. Most importantly, the temperature characteristics (TCF) and the strength of piezoelectric coupling strength of the pure resonance modes are mixed.

Figure 2:
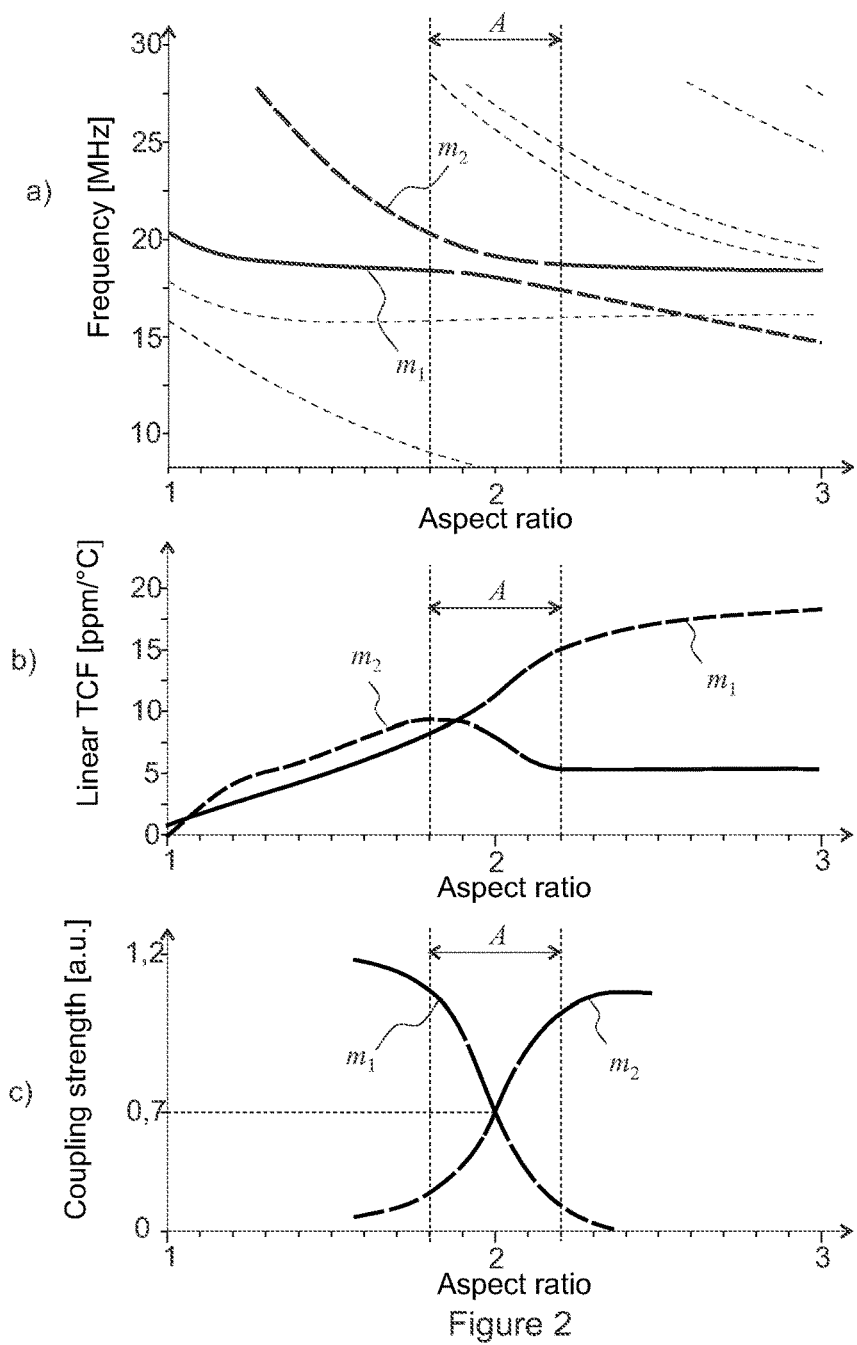
FIGS. 2a to 2c show exemplary diagrams of a coupling between resonance modes.

FIGS. 2a to 2c show exemplary diagrams of a coupling between resonance modes. The diagrams are based on numerical finite element simulations. FIG. 2a shows two mixed mode branches, i.e. a first mixed mode $m_1$ and a second mixed mode $m_2$, resulting from a coupling between a pure WE mode and a shear mode. In FIG. 2a, frequencies of the two mixed mode branches are shown as functions of the length-to-width aspect ratio of the resonator element. The mixed modes are shown with bold lines. Some other modes are shown in the background with dashed curves. The first mixed mode $m_1$ starts as a pure WE mode (shown as a bold solid line) that turns into a pure shear mode (shown as bold dashed line). In contrast, the second mixed mode $m_2$ starts as a shear mode (shown as a bold dashed line) that turns into a pure WE mode (shown as a bold solid line). FIG. 2a also shows a mixing zone A around aspect ratio 2 (i.e. length:width=2:1). In the mixing zone, both of the pure modes contribute to the characteristics of the mixed modes.

FIG. 2b shows the linear TCF term of the first mixed mode $m_1$ and the second mixed mode $m_2$ of FIG. 2a as functions of the aspect ratio. In the simulation, only the contribution from the silicon (Si) portion has been taken into account, i.e., effects to the TCF from the AlN and Mo portions have been neglected. The first mixed mode $m_1$ has initially linear TCF corresponding to the linear TCF of a pure WE mode, and the second mixed mode $m_2$ has a linear TCF corresponding to the linear TCF of a shear mode. Then, in the mixing zone A, the TCF characteristics of the pure shear mode are coupled to the first mixed mode $m_1$ and the TCF characteristics of the pure WE mode are coupled to the second mixed mode $m_2$. As a result, the first mixed mode has a notably higher linear TCF (about +3 ppm/° C. higher) in the mixing zone than what the pure WE mode would have. In return, the second mixed mode has a lower linear TCF than what the pure shear mode would have.

FIG. 2c shows the coupling strength of the first mixed mode $m_1$ and the second mixed mode $m_2$ of FIG. 2a as a function of the aspect ratio. The coupling strength represents the coupling of the mixed modes to the piezoelectric actuation generated with the piezoelectric structure. The portions of the mixed mode branches with characteristics of pure shear mode (shown as bold dashed line portions in FIG. 2c) are only weakly coupled using piezoelectrical actuation. However, at the mixing zone A, both of the mixed mode branches have a relatively strong coupling. At the aspect ratio of about 2:1, the coupling of both branches is approximately equal and approximately 50% of the pure WE mode. In terms of electromechanical resistance $R_m$, typical values may be 50 Ohm and 100 Ohm for the pure WE mode and the first (or the second) mixed mode, respectively.

By having a length-to-width aspect ratio (the length being the longer dimension) in a range of 1.8 to 2.2, preferably 2.0, for the resonator element, the linear TCF of the resonator element may be increased. With the first mixed mode that is the lower-frequency mode of the two mixed modes, one has the possibility to trade off 50% of the coupling for 3 ppm/° C. higher linear TCF. The in-plane dimensions of the resonator element may be 320×160 µm, for example. However, other in-plane dimensions may also be used.

In order for an oscillator to lock into a correct resonance, it may be desirable to have a resonator to have a pure spectrum of resonance modes. In other terms, it may be desirable to avoid parasitic resonance modes. This requirement has a potential to be challenging if the above-described mixed modes are to be utilized in an oscillator. Suppressing the unwanted second mixed mode may be required.

Spatial mode shapes of the desired first mixed mode and undesired second mixed mode are very different. With optimized anchoring, the unwanted mode can be suppressed by increasing the acoustic losses (thus decreasing the quality factor of the resonator). The desired first mixed mode has two nodal points of the oscillation mode at the perimeter, while the mode shape of the unwanted second mixed mode at those locations has a relatively large displacement. In this context, a nodal point is a location at the periphery (e.g. side) of the resonator, at which oscillation amplitude is zero or negligible. In contrast, an anti-nodal point is a location at which oscillation amplitude is large, i.e. a location experiencing large displacements.

Figure 3:
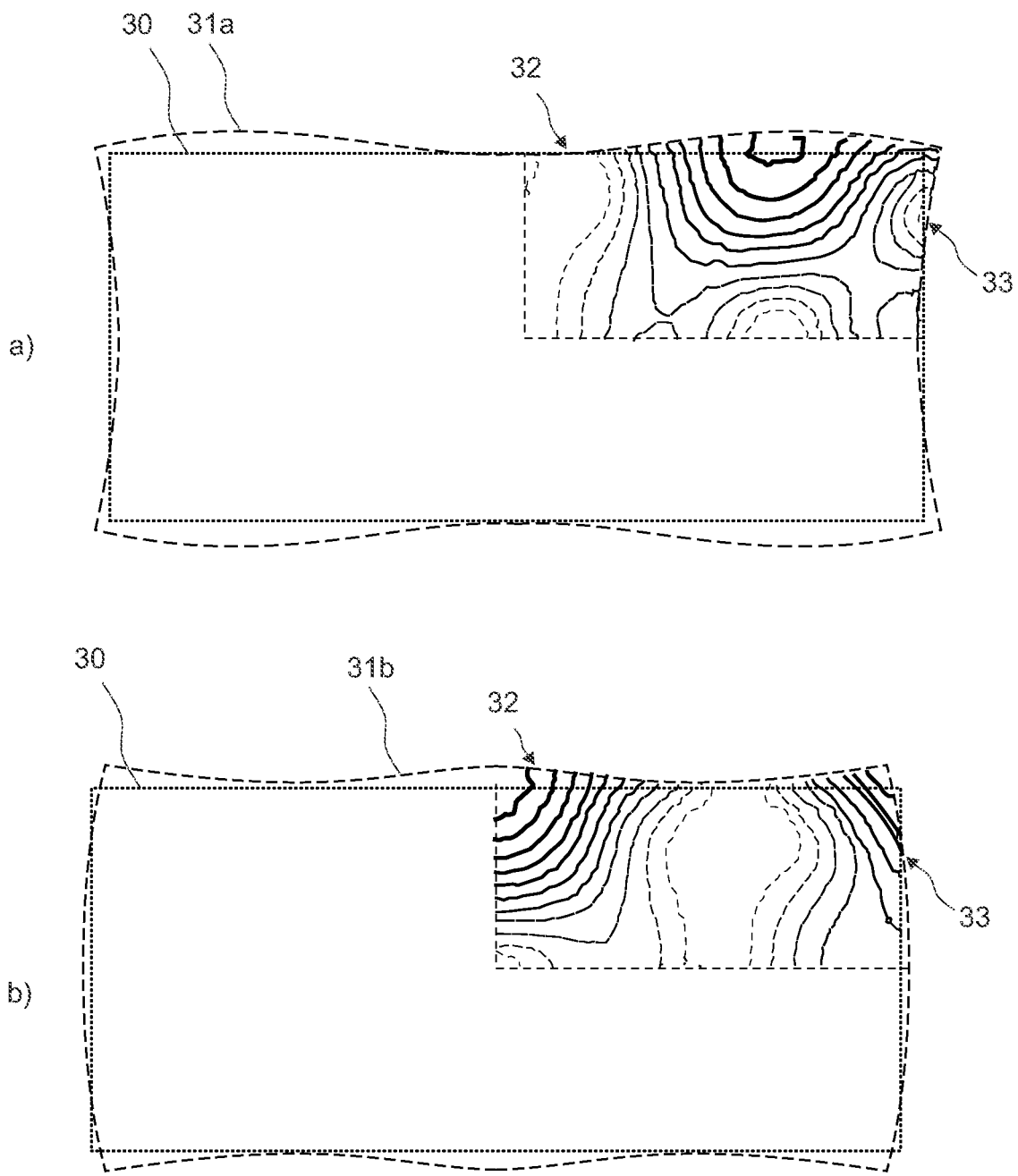
FIGS. 3a and 3b show exemplary spatial mode shapes of the two mixed modes of a resonator element.

FIGS. 3a and 3b show exemplary spatial mode shapes the two mixed modes of a resonator element 30. The total displacement (perpendicular and/or to parallel to the side of the resonator element) is shown with contour lines. Thicker, solid lines show a large displacement, and thinner, dashed lines show smaller displacement. The contour lines are shown only in one quarter of the resonator element 30 in FIGS. 3a and 3b. However, due to symmetry, corresponding displacements are present in the other three quarters. Dashed outlines 31a and 31b of the resonator element further visualize mode shapes of the two mixed modes.

FIG. 3a shows the spatial mode shape of the desired first mixed mode. In FIG. 3a, two locations 32 and 33 at the sides of the resonator element 30 with minimal displacements are shown. FIG. 3b shows the spatial mode shape of the undesired second mixed mode. In the undesired second mixed mode, the two locations 32 and 33 at the sides of the resonator element show large displacement.

By anchoring the resonator at locations that act as nodal points for the desired mode but as anti-nodal points for the undesired mode, the desired mode can be made to have much lower losses than the unwanted mode. In other words, the anchors may be positioned at locations that are nodal points for the desired mode but anti-nodal points for the undesired mode. By anchoring the resonator at multiple locations, other parasitic modes may be suppressed and a cleaner spectrum may be produced.

Figure 4:
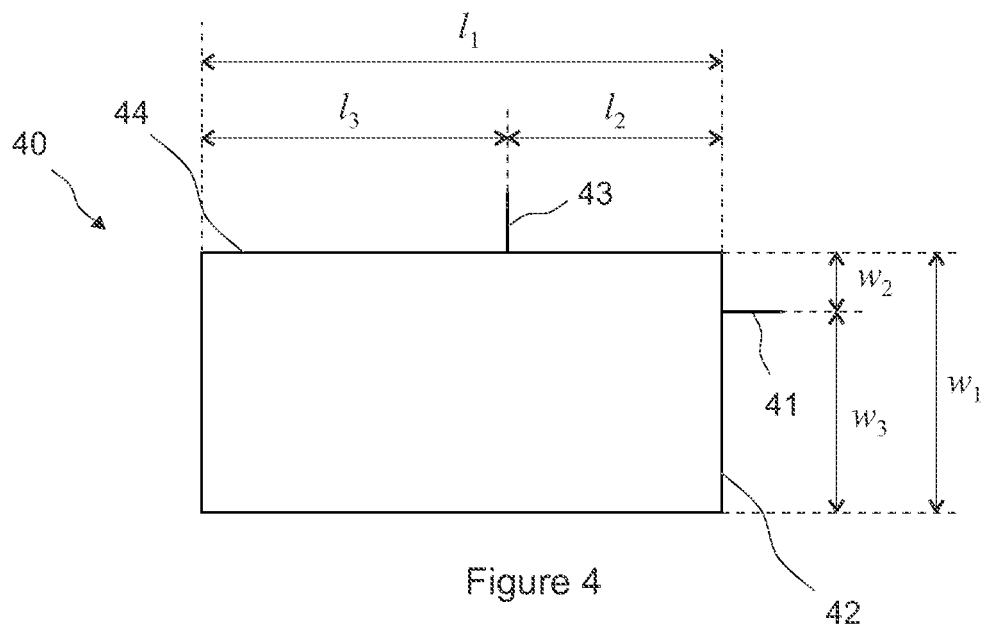
FIG. 4 illustrates exemplary first and second location for anchors in a resonator according to the present disclosure.

A resonator element according to the present disclosure may be suspended to a support structure with two or more anchors. Each of the two or more anchors may be attached to a first location or a second location. FIG. 4 illustrates exemplary first and second location for anchors in a resonator according to the present disclosure.

The first location is at a shorter, widthwise side of the resonator element. The first location divides the width of the resonator element into a larger portion and a smaller portion. A ratio between said smaller portion and the whole width may be in a range of 0.10 to 0.28. In FIG. 4, the resonator element 40 has a length $l_1$ and a width $w_1$. A first anchor 41 on a shorter, widthwise side 42 of the resonator element 40 divides the width $w_1$ of the resonator element 40 into two width portions $w_2$ and $w_3$. The ratio between the shorter width portion and the width $w_1$ is the range of 0.10 to 0.28.

The second location is at a longer, lengthwise side of the resonator. The second location divides the length of the resonator element into a larger portion and a smaller portion. A ratio between said smaller portion and the whole length may be in a range of 0.36 to 0.50. In FIG. 4, the resonator element comprises a second anchor 43 on its longer, lengthwise side 44. The second anchor 43 divides the length $l_1$ of the resonator element 40 into two length portions $l_2$ and $l_3$. The ratio between the shorter length portion $l_2$ and the length $l_1$ is the range of 0.36 to 0.50.

Figure 5:
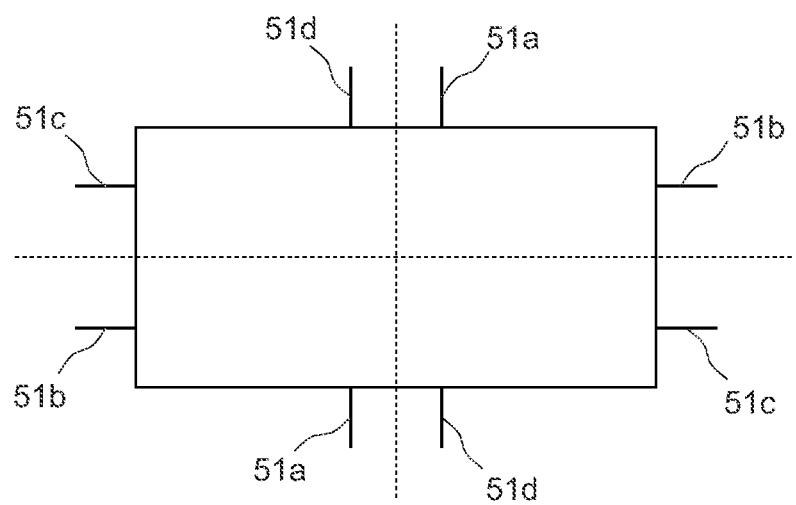
FIG. 5 shows eight possible locations for the anchors.

The two or more anchors may comprise one or more pairs of anchors, wherein the anchors in each pair are in a two-fold rotational symmetry on the resonator element. FIG. 5 shows eight possible locations for the anchors. An anchor pair 51a and an anchor pair 51d are positioned at the above-described first locations on longer, lengthwise sides of a resonator element. They all individually divide the length of the resonator element into a larger portion and a smaller portion such that and ratio between said smaller portion and the whole length is in a range of 0.36 to 0.50. Further, FIG. 5 shows an anchor pair 51b and an anchor pair 51c are positioned at the above-described first locations on shorter, widthwise sides of a resonator element. They all individually divide the width of the resonator element into a larger portion and a smaller portion such that the ratio between said smaller portion and the whole width is in a range of 0.10 to 0.28.

Figure 6:
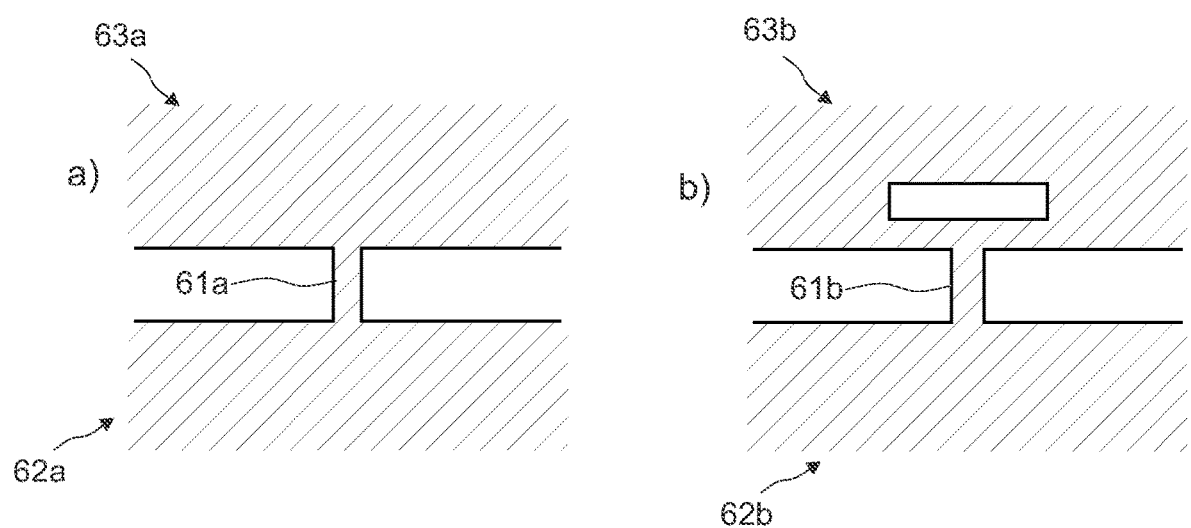
FIGS. 6a and 6b show exemplary anchors.

An anchor can be, for example, a straight or a T-shaped tether connecting the resonator to the substrate. FIGS. 6a and 6b show exemplary anchors. In FIG. 6a, a straight anchor 61a tethers a resonator element 62a to a support structure 63a. In FIG. 6b, a T-shaped anchor 61b tethers a resonator element 62b to a support structure 63b.

As discussed above, a zero linear behavior can be achieved by employing the first mixed mode. The first mixed mode provides only slightly degraded electrical performance (~50% of the coupling strength of a pure WE mode) while at the same time enabling TCF=0 performance. With the first mixed mode, a frequency change within +/−10 ppm can be achieved in the industrial temperature range (−40° C. . . . +85° C.).

It is obvious to a person skilled in the art that the inventive concept can be implemented in various ways. The invention and its embodiments are not limited to the examples described above but may vary within the scope of the claims.

The invention claimed is:

1. A micromechanical resonator comprising a resonator element having a length and a width that is perpendicular to the length, wherein
   the resonator element comprises a first layer structure that comprises a base layer made of a semiconductor material,
   the length of the resonator element extends along a crystalline direction of the semiconductor material,
   the resonator element has a length-to-width aspect ratio in a range of 1.8 to 2.2,
   the resonator element is suspended to a support structure with two or more anchors, wherein each of the two or more anchors is attached to:
   a) a first location at a shorter, widthwise side of the resonator element, wherein the first location divides the width of the resonator element into a larger portion and a smaller portion such that a ratio between said smaller portion and the whole width is in a range of 0.10 to 0.28 or b) a second location at a longer, lengthwise side of the resonator, wherein the second location divides the length of the resonator element into a larger portion and a smaller portion such that a ratio between said smaller portion and the whole length is in a range of 0.36 to 0.50.

2. A resonator according to claim 1, wherein the two or more anchors comprise one or more pairs of anchors, wherein the anchors in each pair are in a two-fold rotational symmetry on the resonator element.

3. A resonator according to claim 1, wherein the resonator element is a compound structure further comprising a second layer structure on top of the first layer structure, wherein linear temperature coefficients of the first layer structure and the second layer structure have opposite signs.

4. A resonator according to claim 1, wherein the semiconductor material is silicon.

5. A resonator according to claim 4, wherein the silicon is doped with a n-type dopant.

6. A resonator according to claim 5, wherein the doping concentration of the silicon is above $2 \cdot 10^{19}$ cm$^{-3}$, preferably above $1 \cdot 10^{20}$ cm$^{-3}$.

* * * * *